(12) United States Patent
Miyajima et al.

(10) Patent No.: US 7,522,643 B2
(45) Date of Patent: Apr. 21, 2009

(54) SEMICONDUCTOR LASER DEVICE

(75) Inventors: Hirofumi Miyajima, Hamamatsu (JP);
Hirofumi Kan, Hamamatsu (JP)

(73) Assignee: Hamamatsu Photonics K.K.,
Hamamatsu-shi, Shizuoka (JP)

( * ) Notice: Subject to any disclaimer, the term of this patent is extended or adjusted under 35 U.S.C. 154(b) by 0 days.

(21) Appl. No.: 11/628,413

(22) PCT Filed: Jul. 6, 2005

(86) PCT No.: PCT/JP2005/012449

§ 371 (c)(1),
(2), (4) Date: Dec. 5, 2006

(87) PCT Pub. No.: WO2006/006455

PCT Pub. Date: Jan. 19, 2006

(65) Prior Publication Data

US 2007/0297473 A1    Dec. 27, 2007

(30) Foreign Application Priority Data

Jul. 8, 2004    (JP)    ............................. 2004-202403

(51) Int. Cl.
*H01S 3/04* (2006.01)
(52) U.S. Cl. ............................. 372/35; 372/34; 372/36
(58) Field of Classification Search .............. 372/34–36
See application file for complete search history.

(56) References Cited

U.S. PATENT DOCUMENTS 4,686,682 A * 8/1987 Haruta et al. ................. 372/87
6,643,302 B1 * 11/2003 Nishikawa et al. ............ 372/35

FOREIGN PATENT DOCUMENTS

| JP | 2001-044555 | 2/2001 |
|---|---|---|
| JP | 2003-110186 | 4/2003 |
| JP | 2003-273441 | 9/2003 |
| JP | 2004-031783 | 1/2004 |
| JP | 2004-053167 | 2/2004 |

* cited by examiner

*Primary Examiner*—Minsun Harvey
*Assistant Examiner*—Patrick Stafford
(74) *Attorney, Agent, or Firm*—Drinker Biddle & Reath LLP

(57) ABSTRACT

The present invention relates to a semiconductor laser apparatus having a metal body which efficiently cools a semiconductor laser element, in which joining of copper-made members coated with DLC layers and prevention of corrosion in the vicinity of joined portions are possible. The semiconductor laser apparatus has a metal body as a heat sink for cooling the semiconductor laser element. The metal body is constituted by a plurality of copper-made members, and the surfaces of each copper-made members are continuously coated with a diamond carbon layer except for regions corresponding to an exposed region in which the semiconductor laser element is mounted.

5 Claims, 12 Drawing Sheets

SEMICONDUCTOR LASER DEVICE

TECHNICAL FIELD

The present invention relates to a semiconductor laser apparatus which has a semiconductor laser element as a light emitting source and has a structure for efficiently cooling this semiconductor laser device.

BACKGROUND ART

As a heat sink essential for cooling a heating element such as a semiconductor laser element with a high output, a metal body which is constituted by joining a plurality of metal members such as copper-made members and has a structure for circulating a fluid for cooling a heating element in a fluid channel provided inside, is known.

For cooling a semiconductor laser element, normally, a construction in which a plurality of metal bodies are stacked so as to sandwich the semiconductor laser element is employed. In this case, each metal body not only cools each semiconductor laser element but also serves as an electrical conduction path among semiconductor laser elements, so that an electrical potential difference occurs between the circulating fluid and the metal body.

Therefore, when the fluid circulates inside the metal body for a long period of time of about 10000 hours, as shown in FIG. 6, due to the electrochemical reaction process of a portion (a part of the metal body) in contact with the fluid, volume reduction occurs on the anode side of the metal body, and on the cathode side, corrosion products of copper accumulate and adhere thereto.

Such corrosion can be restrained by lowering the conductivity of the fluid. However, the lowering in conductivity (that is, an increase in resistance) increases the activity of the fluid, so that the corrosiveness due to the volume reduction of the metal body increases inversely. In addition, the device for lowering the conductivity becomes large in size and high in cost, so that the lowering in conductivity of the fluid is not suitable for prevention of corrosion. Furthermore, a leakage current flows due to the lowering in conductivity, so that if the fluid circulates during the working period on the order of several years (actual working hours: several ten-thousand hours), the corrosion influence arises.

To prevent such corrosion, it has been attempted to form an isolation layer which prevents contact between the inner wall face of the metal body and the fluid, on this inner wall face without deterioration of the heat exchange performance. For example, in Patent Document 1, a metal such as Au or an Au alloy is employed as an isolation layer. In Patent Document 2, artificial crystals such as artificial diamond and artificial sapphire are employed as an isolation layer.

Patent Document 1: Japanese Patent Application Laid-Open No. 2003-273441

Patent Document 2: Japanese Patent Application Laid-Open No. 2003-110186

DISCLOSURE OF THE INVENTION

Problems that the Invention is to Solve

The present inventors have examined the above prior art, and as a result, have discovered the following problems. Namely, when a metal such as Au or an Au alloy is applied as an isolation layer, pin hole-shaped coating defects easily occur in the isolation layer and great pitting corrosion occurs. It is difficult to make artificial crystals such as artificial diamond and artificial sapphire grow on a metal surface.

Therefore, the inventors examined use of DLC (diamond-like carbon) which grew on the metal surface more easily than the artificial crystals, as the isolation layer. The DLC layer is produced by a thin-film forming method such as the CVD method (chemical vapor deposition method), etc., so that it can cover the details of the metal body without defects, so that the above-described problem can be overcome.

However, when copper-made members coated with the DLC layers as isolation layers are joined, due to the presence of the DLC layers, it is difficult to join these copper-made members by means of copper diffusion bonding. Even when only the joined surface between the copper-made members is not coated with the DLC layer but is exposed to make joining easy, when the fluid leaks, corrosion as described above occurs from the joined portion.

The present invention has been developed to eliminate the problems described above. It is an object of the present invention to provide a semiconductor laser apparatus including a metal body for efficiently cooling a semiconductor laser element, in which joining of copper-made members coated with DLC layers and prevention of corrosion in the vicinity of the joined portion are possible.

Means for Solving the Problems

To solve the problem, a semiconductor laser apparatus according to the present invention comprises a metal body, an adhesive, diamond carbon layers, and a semiconductor laser element. The metal body is constituted by a plurality of copper members, and is provided with a fluid channel therein. The adhesive is interposed between these copper-made members. Each of the diamond carbon layers continuously coats the surfaces of each copper-made member while an exposed region set on the metal body is left. The semiconductor laser element is mounted on the exposed region that is not coated with the diamond-like carbon layers.

Herein, the metal body is obtained by bonding a plurality of copper-made members whose surfaces are continuously coated with the DLC layers while the adhesive is interposed between the copper-made members. In this construction, bonding between copper-made members and prevention of corrosion in the vicinity of the bonded portions are realized. Furthermore, by continuously coating the surfaces of the copper-made members with the DLC layers, corrosion resistance can be remarkably improved without deterioration of the heat exchange performance. On the other hand, while the exposed region is not coated with the DLC layers, the semiconductor laser element is mounted on the exposed region. In this construction, by circulating a fluid in the fluid channel, the semiconductor laser element is efficiently cooled.

It is preferable that at least one of the plurality of copper-made members has a through hole constituting a part of the flow channel, and at least one of the remaining copper-made members has a groove that is communicated with the through hole and constitutes a part of the fluid channel. When this construction is employed, by bonding the copper-made members, a metal body having a fluid channel continuously coated with the DLC layers formed inside can be easily constructed.

It is preferable that the metal body has a penetrating conductor that penetrates the metal body in a region in which the fluid channel is not formed. In this construction, when the metal body is arranged by being sandwiched by a plurality of semiconductor laser elements, the metal body can serve as an electrical conduction path among the semiconductor laser elements.

Furthermore, it is preferable that the semiconductor laser element is mounted on the exposed region while maintaining electrical contact with the metal body. In this construction, when the metal body is arranged by being sandwiched by a plurality of semiconductor laser elements, the metal body can serve as an electrical conduction path among the semiconductor laser elements.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

EFFECTS OF THE INVENTION

In accordance with the present invention, a semiconductor laser apparatus having a metal body for efficiently cooling a semiconductor device, in which joining of copper-made members whose surfaces are continuously coated with DLC layers and prevention of corrosion of the copper-made members in the vicinity of joined portions are possible, is obtained.

DESCRIPTION OF THE REFERENCE NUMERALS

Figure 1:
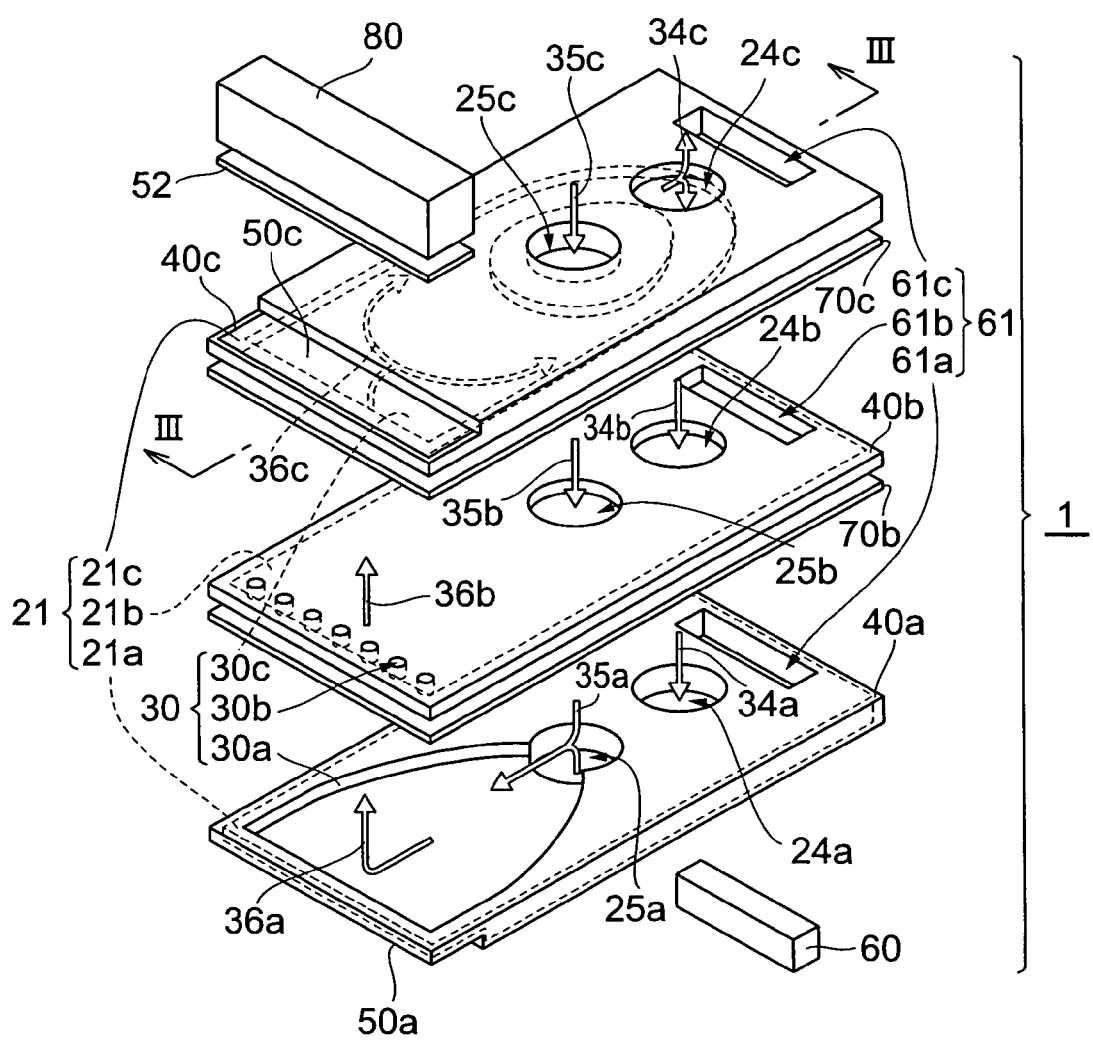
FIG. 1 is an exploded perspective view showing a construction of a first embodiment of a semiconductor laser apparatus according to the present invention.

1 . . . semiconductor laser apparatus; 21 . . . metal body; 21X . . . metal body on the highest layer; 21Y . . . metal body on the lowest layer; 21a . . . first copper-made member; 21b . . . second copper-made member; 21c . . . third copper-made member; 21d, 21e, 21f, 21g, 21h . . . copper-made member; 22 . . . outer wall face; 24a, 24b, 24c, 25a, 25b, 25c . . . through hole; 27a . . . fixing screw; 27b . . . screw hole; 30 . . . fluid channel; 30a, 30c . . . groove; 30b . . . through hole; 31 . . . flow inlet; 32 . . . flow outlet; 33 . . . inner wall face; 40a, 40b, 40c . . . DLC layer; 50a, 50c . . . exposed region; 52 . . . soldering material; 60, 60X, 60Y . . . penetrating conductor; 61, 61X, 61Y . . . housing hole; 61a, 61b, 61c . . . conductor hole; 70b, 70c . . . adhesive; 80 . . . semiconductor laser element; 81 . . . n-side electrode; 82 . . . dummy spacer; 83 . . . silicon rubber; and 90 . . . power source.

BEST MODES FOR CARRYING OUT THE INVENTION

In the following, embodiments of a semiconductor laser apparatus according to the present invention will be explained in detail with reference to FIGS. 1 to 12. In the description of the drawings, identical or corresponding components are designated by the same reference numerals, and overlapping description is omitted. In addition, the dimensional ratios of the drawings are not always equal to those explained, and are not limited to those explained.

First Embodiment

First, a first embodiment of the semiconductor laser apparatus according to the present invention will be explained. FIG. 1 is an exploded perspective view showing a construction of a semiconductor laser apparatus 1 according to the first embodiment.

The semiconductor laser apparatus 1 comprises a metal body 21, adhesives 70b and 70c, DLC layers (diamond-like carbon layers) 40a, 40b, and 40c, and a semiconductor laser element 80.

The metal body 21 is formed by bonding a first copper-made member 21a, a second copper-made member 21b, and a third copper-made member 21c, and is provided with a fluid channel 30 inside. The metal body 21 has a penetrating conductor 60 which penetrates the metal body 21 in a region in which the fluid channel 30 is not formed, and a housing hole 61 for housing the penetrating conductor 60. The housing hole 61 consists of three conductor holes 61a, 61b, and 61c. On the metal body 21, exposed regions 50a and 50c are set.

Figure 2:
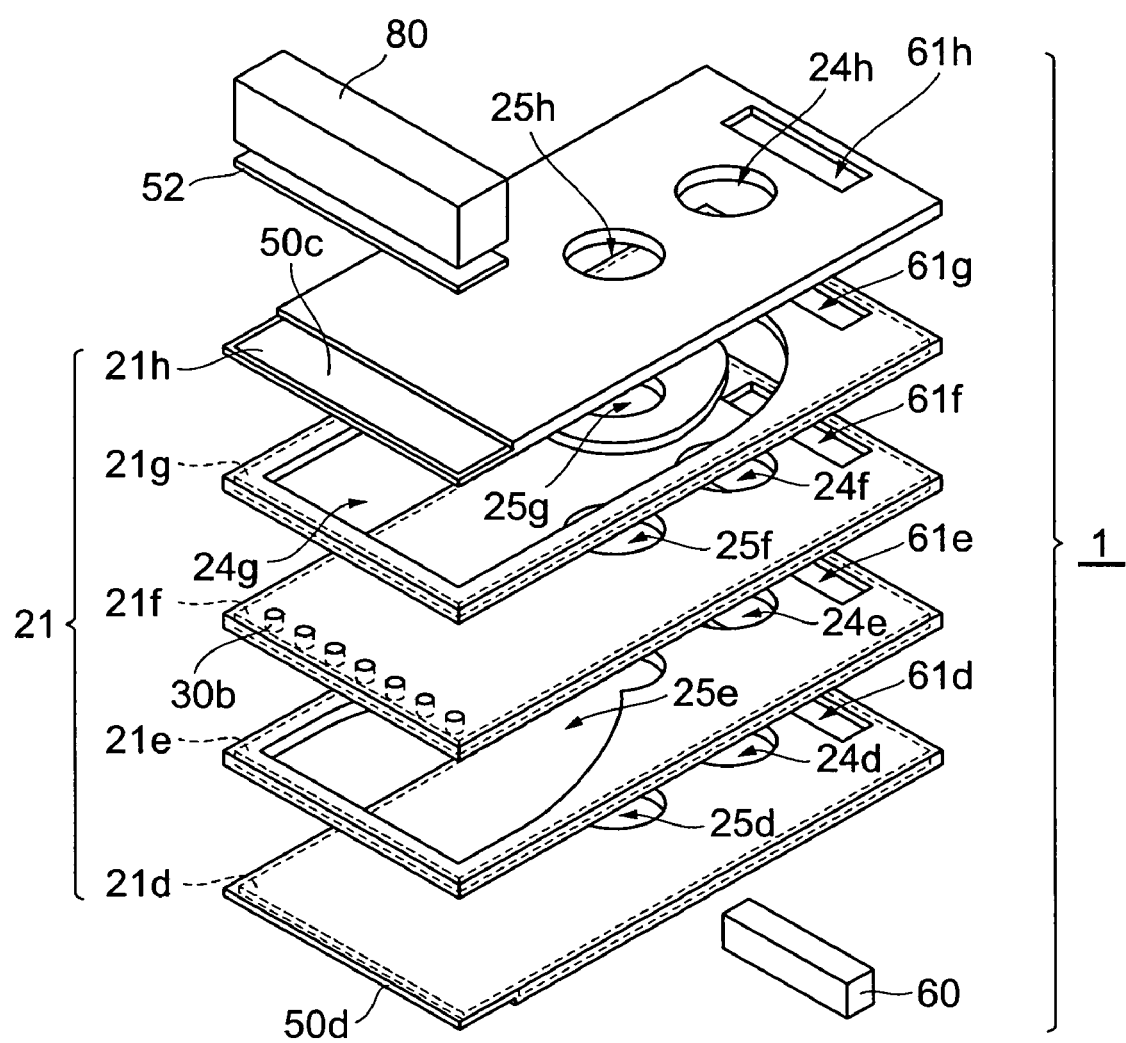
FIG. 2 is an exploded perspective view showing another construction of the semiconductor laser apparatus according to the first embodiment.

FIG. 2 is an exploded perspective view showing another structure of the semiconductor laser apparatus 1 according to the first embodiment.

The metal body 21 may be formed by five copper-made members 21d through 21h as shown in FIG. 2.

Furthermore, each of the copper-made members may have a through hole 30b forming a part of the fluid channel 30 when the members are joined or have a groove 30a or 30c which is connected to the through hole 30b and forms a part of the fluid channel 30 as shown in FIG. 1. In this case, by bonding the copper-made members, the metal body 21 having the fluid channel 30 inside is easily formed. The fluid channel 30 has a flow outlet 32 (see FIG. 3) formed by through holes 24a, 24b, and 24c and a flow inlet 31 (see FIG. 3) formed by through holes 25a, 25b, and 25c.

The surfaces of the three copper-made members 21a, 21b, and 21c are continuously coated with the DLC layers 40a, 40b, and 40c while the exposed regions 50a and 50c are left. Therefore, the inner wall face of the fluid channel 30 is continuously coated with the DLC layers. The copper-made members preferably have good heat conductivity. Between the copper-made members 21a and 21b coated with the DLC layers, the adhesive 70b is interposed, and between the copper-made members 21b and 21c, the adhesive 70c is interposed.

The first copper-made member 21a includes two through holes 24a and 25a, a groove 30a, and a conductor hole 61a. The groove 30a has a depth about half the thickness of the copper-made member 21a, and a part of the groove is connected to the through hole 25a.

The third copper-made member 21c has two through holes 24c and 25c at positions overlapping the respective through holes 24a and 25a of the first copper-made member 21a, and has a conductor hole 61c at a position overlapping the conductor hole 61a of the first copper-made member 21a. The third copper-made member 21c has a groove 30c having a depth that is about half the thickness of the third copper-made member 21c, and a part of the groove is connected to the through hole 24c. Herein, a part of the groove 30c overlaps the groove 30a of the first copper-made member 21a.

The second copper-made member 21b has two through holes 24b and 25b at positions overlapping the respective through holes 24a and 25a of the first copper-made members 21a, and has a conductor hole 61b at a position overlapping the conductor hole 61a of the first copper-made member 21a. At a portion where the groove 30a of the first copper-made member 21a and the groove 30c of the third copper-made member 21c, a plurality of through holes 30b are formed. The plurality of through holes 30b are formed at positions overlapping the exposed regions 50a and 50c.

By coating the three copper-made members 21a, 21b, and 21c with the respective DLC layers 40a, 40b, and 40c as described above, the corrosion resistance can be remarkably improved without deterioration of the heat exchange performance. Furthermore, the exposed regions 50a and 50c are not coated with the respective DLC layers 40a and 40c, and on the exposed region 50c positioned so as to overlap the plurality of through holes 30b, the semiconductor laser element 80 is mounted. Thereby, by circulating a fluid into the fluid channel 30, the semiconductor laser element 80 mounted on the exposed region 50c is efficiently cooled.

The adhesives 70b and 70c have a function for bonding the copper-made members whose respective surfaces are continuously coated with the DLC layers. The adhesive 70b bonds the contact portion between the first copper-made member 21a and the second copper-made member 21b. The adhesive 70c bonds the contact portion between the second copper-made member 21b and the third copper-made member 21c. By thus applying the adhesives 70b and 70c, bonding of the copper-made members coated with the DLC layers and prevention of corrosion in the vicinity of the bonded portions are realized.

Herein, the adhesives 70b and 70c are not particularly limited as long as they have the above-described bonding function, and for example, an urethane-based adhesive (brand name: HARDLOC C-351, etc.) made by Denki Kagaku Kogyo KK, an adhesive (brand name: LO-210, etc.) made of an anaerobic resin by Loctite Corporation, and an epoxy-based adhesive (brand name: DP-pure 60, etc.) made by 3M Corporation are available.

The semiconductor laser element 80 is mounted on the exposed region 50c. The semiconductor laser element 80 emits a laser beam when a voltage is applied thereto. The semiconductor laser element 80 is positioned on the exposed region 50c while maintaining thermal contact with the third copper-made member 21c forming the metal body 21.

It is also possible that the semiconductor laser element 80 is arranged on the exposed region 50c while maintaining electrical contact with the exposed region 50c by the soldering material 52. With this construction, when the metal body 21 is arranged by being sandwiched by a plurality of semiconductor laser elements 80, the metal body 21 itself can serve as an electrical conduction path among the semiconductor laser elements 80.

A penetrating conductor 60 is housed in the housing hole 61 provided in the metal body 21. The housing hole 61 is formed by overlapping three conductor holes 61a, 61b, and 61c when the three copper-made members 21a, 21b, and 21c are bonded together, and penetrates the metal body 21 in a region in which the fluid channel 30 is not formed. The inner wall face of the housing hole 61 is not continuously coated with the DLC layers, and by housing the penetrating conductor 60 in the housing hole 61, when the metal body 21 is arranged by being sandwiched by a plurality of semiconductor laser elements 80, the metal body 21 itself serves as an electrical conduction path among the semiconductor laser elements 80.

The penetrating conductor 60 is not particularly limited as long as it is a conductor, and may be a rod-shaped conductive material, communicating material, a metal material whose electrical resistance is low, or the like. The penetrating conductor 60 may be coated with molten metal for lowering the contact resistance with a soldering material or brazing material. Furthermore, the penetrating conductor 60 is also obtained by pouring molten metal such as solder into the housing hole 61 and immobilizing the poured metal.

Next, the flow of the fluid will be explained.

A fluid that has flown-in from the through hole 25a or the through hole 25c circulates along the direction of the white arrow, and then flows out from the through hole 24a or the through hole 24c. Namely, the fluid that has flown into the flow inlet flows into the through hole 30b through the flow channel formed by the groove 30a of the first metal member 21a and the lower surface of the second metal member 21b. Then, the fluid flows into the flow outlet through the flow channel formed by the upper surface of the second metal member 21b and the groove 30c of the third metal member 21c. Furthermore, the fluid is branched upward or downward in the drawing in the vicinity of the through hole 24c and flows out. Last, the fluid flows out from the through hole 24a or the through hole 24c.

Figure 3:
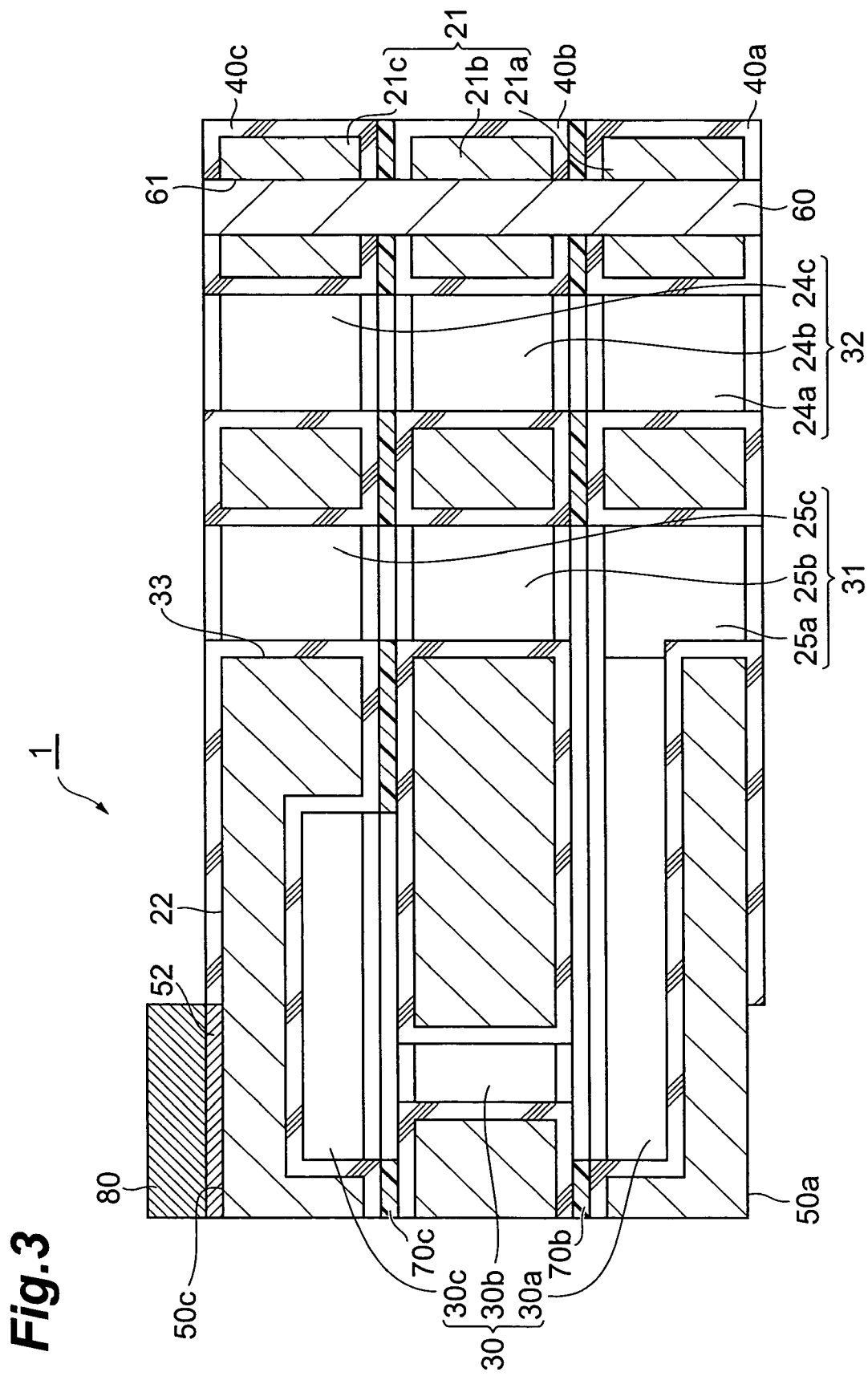
FIG. 3 is a sectional view of the semiconductor laser apparatus along the III-III line of FIG. 1.

Hereinafter, a sectional structure of the semiconductor laser apparatus 1 according to the first embodiment will be explained. FIG. 3 is a sectional view of the semiconductor laser apparatus 1 along the III-III line of FIG. 1.

The through hole 25a of the first copper-made member 21a, the through hole 25b of the second copper-made member 21b, and the through hole 25c of the third copper-made member 21c are linked together to form a flow inlet 31 for supplying the fluid to the groove 30a. The through hole 24a of the first copper-made member 21a, the through hole 24b of the second copper-made member 21b, and the through hole 24c of the third copper-made member 21c are linked together to form a flow outlet 32 for making the fluid flow out from the groove 30c.

As described above, the groove 30a, the through hole 30b, and the groove 30c form the fluid channel 30. The fluid channel 30 has the flow inlet 31 and the flow outlet 32.

The surfaces of the respective three copper-made members 21a, 21b, and 21c are continuously coated with the respective DLC layers 40a, 40b, and 40c while the exposed regions 50a and 50c are left. With this construction, prevention of corrosion in the vicinity of the contact portion between the outer wall face 22 and the inner wall face 33 of the metal body 21, that is, at the edge portion, is realized. Furthermore, prevention of electrical short-circuits when water leakage or the like occurs at the edge portion is also realized. For preventing short-circuits, in the connecting portion between the flow inlet 31 of the fluid and the supply portion to which the fluid is supplied, an interposing object such as an O-ring may be interposed.

Figure 4:
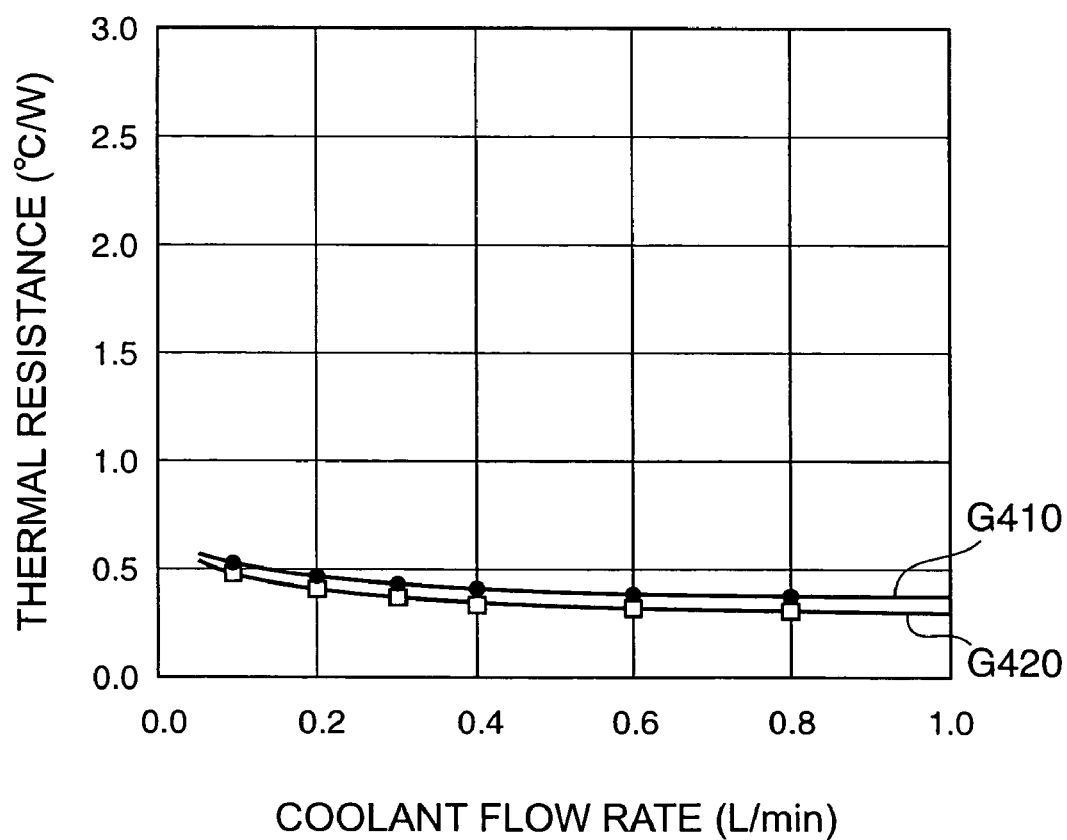
FIG. 4 is a graph showing a change in heat resistance due to a difference of an isolation layer when a coolant flow rate is changed.

Next, the DLC layers 40a, 40b, and 40c coating the three copper-made members 21a, 21b, and 21c forming the metal body 21 will be explained. FIG. 4 is a graph showing changes in thermal resistance when the coolant flow rate is changed in a case where the DLC layer is applied as an isolation layer (curve G410) and in a case where the product (conventional product) according to the Patent Document 1 is applied (curve G420).

As an isolation layer coating the heat sink, a DLC layer is applied. Thereby, in comparison with the case where a metal-made isolation layer is applied, occurrence of pin holes is remarkably reduced. Thermal resistance when the DLC layer is applied as the isolation layer is not greatly different from that in the case where the conventional product is applied as the isolation layer as shown in FIG. 4, and adverse influence from the application of the DLC layer is very small.

Figure 5:
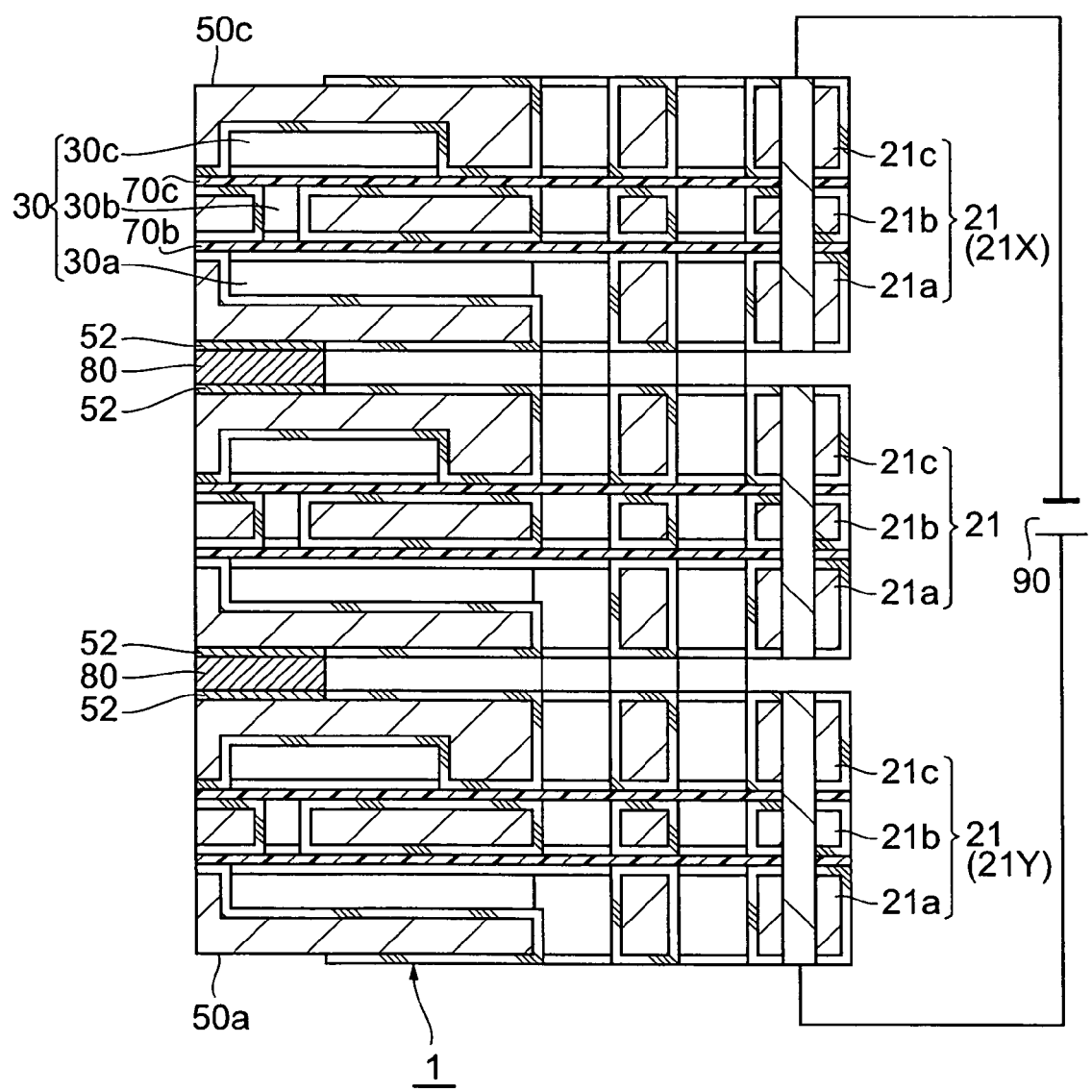
FIG. 5 is a drawing showing a construction in which the semiconductor laser apparatus according to the first embodiment is stacked in a plurality of stages.

Next, an apparatus in which the semiconductor laser apparatus according to the first embodiment is stacked in a plurality of stages will be explained. FIG. 5 is a drawing showing a construction in which the semiconductor laser apparatus 1 is stacked in a plurality of stages.

For example, as shown in FIG. 5, the three metal bodies 21, 21X, and 21Y are stacked while sandwiching two semiconductor laser elements 80. The metal body 21X on the highest layer is connected to the negative electrode of the power source 90 and the metal body 21Y on the lowest layer is connected to the positive electrode of the power source 90. Thereby, the metal bodies 21, 21X, and 21Y simultaneously perform the functions of cooling the semiconductor laser elements 80 and serving as electrical conduction paths between the semiconductor laser elements 80, so that a potential difference occurs between the fluid and the metal bodies.

Figure 6:
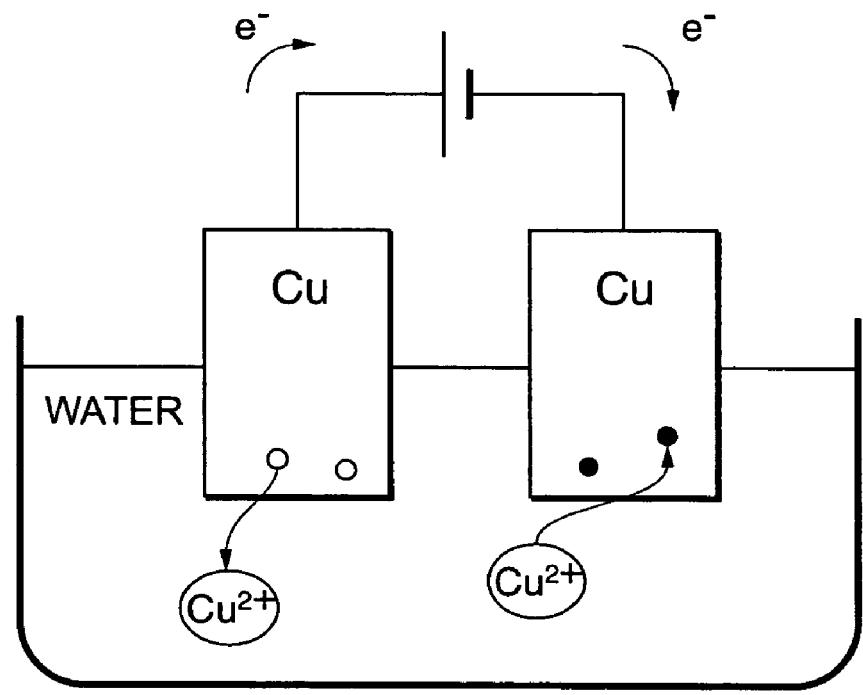
FIG. 6 is a drawing for explaining a copper corrosion mechanism.

Next, a copper corrosion mechanism and a construction that at least the present invention should be applied to will be explained. FIG. 6 is a drawing for explaining the copper corrosion mechanism.

In a conventional apparatus, corrosion occurs due to the copper corrosion mechanism caused by the above-described potential difference. Namely, while copper volume reduction occurs on the anode (positive electrode) side of the metal body, corrosion products accumulate and adhere to the cathode (negative electrode) side. For example, in the case of the construction shown in FIG. 5, corrosion of copper occurs on the metal bodies 21X and 21Y on the highest layer and the lowest layer. It is considered that this corrosion is caused by the above-described reaction between the fluid and the copper-made member. In this case, by applying the construction of the present invention to at least the metal bodies 21X and 21Y (see FIG. 5) on the highest layer and the lowest layer, the problem is solved.

Next, a method for manufacturing the semiconductor laser apparatus 1 will be explained. By performing the following processes (1) through (3) in order, the semiconductor laser apparatus 1 is obtained.

(Process (1): DLC Layer Coating Process)

Figure 7:
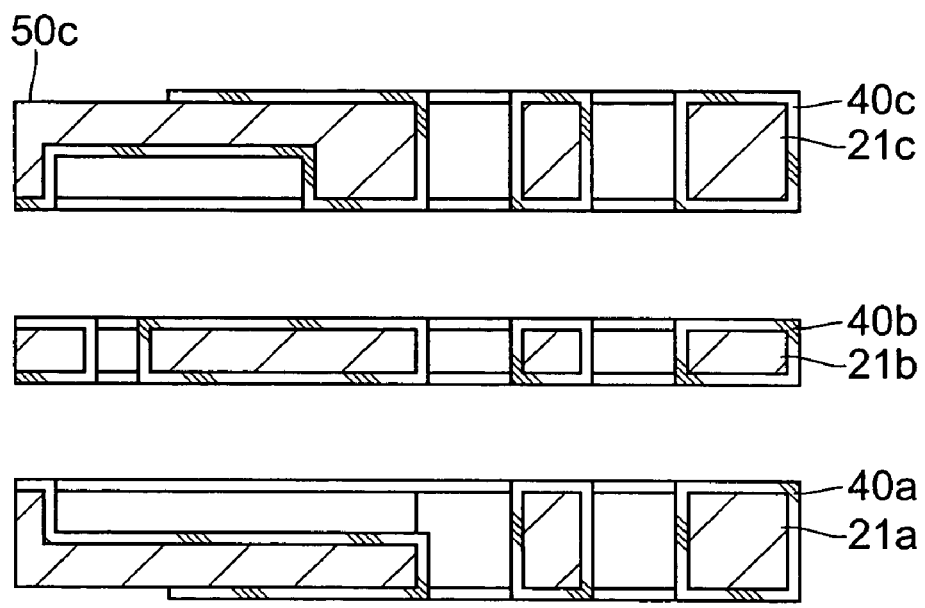
FIG. 7 is a drawing for explaining a DLC layer coating process.

FIG. 7 is a drawing for explaining the DLC layer coating process.

First, as shown in FIG. 7, the first copper-made member 21a, the second copper-made member 21b, and the third copper-made member 21c are coated with DLC layers as isolation layers. Coating of the DLC layers is performed following usual procedures by means of the CVD method as a thin-film forming method. Namely, by the CVD method using a hydrocarbon gas such as methane gas or benzene gas, etc., as a gas containing carbon, the surfaces of the copper-made members to be used as base materials are coated with the DLC layers.

Herein, when performing coating by the CVD method, the exposed region 50c is covered by a mask or the like in advance. By removing the mask or the like after depositing the DLC layer, the DLC layer is deposited on the surface of the copper-made member while the exposed region 50c is left. As a result, the respective three copper-made members 21a, 21b, and 21c are continuously coated with the DLC layers 40a, 40b, and 40c as isolation layers and corrosion is restrained by the function of the DLC layers 40a, 40b, and 40c.

(Process (2): Member Joining Process)

Figure 8:
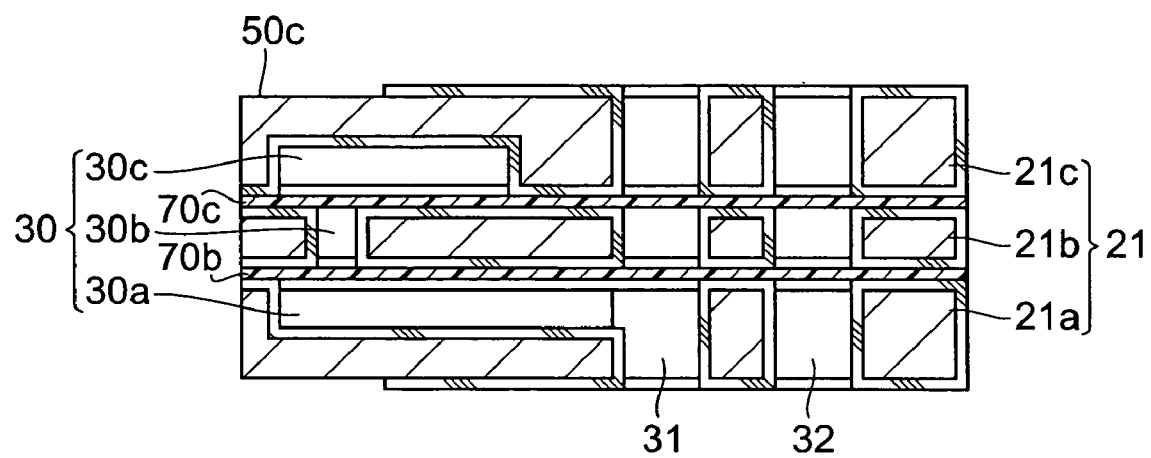
FIG. 8 is a drawing for explaining a member joining process.

FIG. 8 is a drawing for explaining the member joining process.

Next, as shown in FIG. 8, by these three copper-made members 21a, 21b, and 21c bonded by the adhesives 70b and 70c interposed between the members, the metal body 21 is formed. Bonding of the members is performed on the surfaces facing each other via the adhesives 70b and 70c in a state that the three copper-made members are stacked. By this bonding, the fluid channel 30 that communicates the flow inlet 31 and the flow outlet 32 for the fluid is formed inside the metal body 21.

(Process (3): Arranging Process of Penetrating Conductor and Laser Device)

Next, as shown in FIG. 3, a housing hole 61 is formed so as to penetrate the metal body 21 including the three copper-made members 21a, 21b, and 21c bonded to each other. The inner wall face of the housing hole 61 is not coated with the DLC layers. In this housing hole 61, the penetrating conductor 60 is housed. With this construction, the metal body 21 becomes electrically conductive, and when the metal body 21 is arranged by being sandwiched by a plurality of semiconductor laser elements 80, the metal body 21 itself can serve as an electrical conduction path among the semiconductor laser elements 80. The penetrating conductor 60 is not particularly limited as long as it is a conductor.

Next, the semiconductor laser element 80 is mounted on the exposed region 50c. As a result, the semiconductor laser apparatus 1 is obtained. The semiconductor laser element 80 is mounted on the exposed region 50c while maintaining thermal contact with the exposed region 50c. In this construction, by circulating the fluid in the flow channel 30, the semiconductor laser element 80 is efficiently cooled.

Herein, the semiconductor laser element 80 may be mounted on the exposed region 50c while maintaining electrical contact with the metal body 21 by means of the soldering material 52. In this construction, when the metal body 21 is arranged by being sandwiched by a plurality of semiconductor laser elements 80, the metal body 21 itself serves as an electrical conduction path among the semiconductor laser elements 80. The procedures of the arrangement of the penetrating conductor 60 and the arrangement of the semiconductor laser element 80 may be reversed.

Second Embodiment

Figure 9:
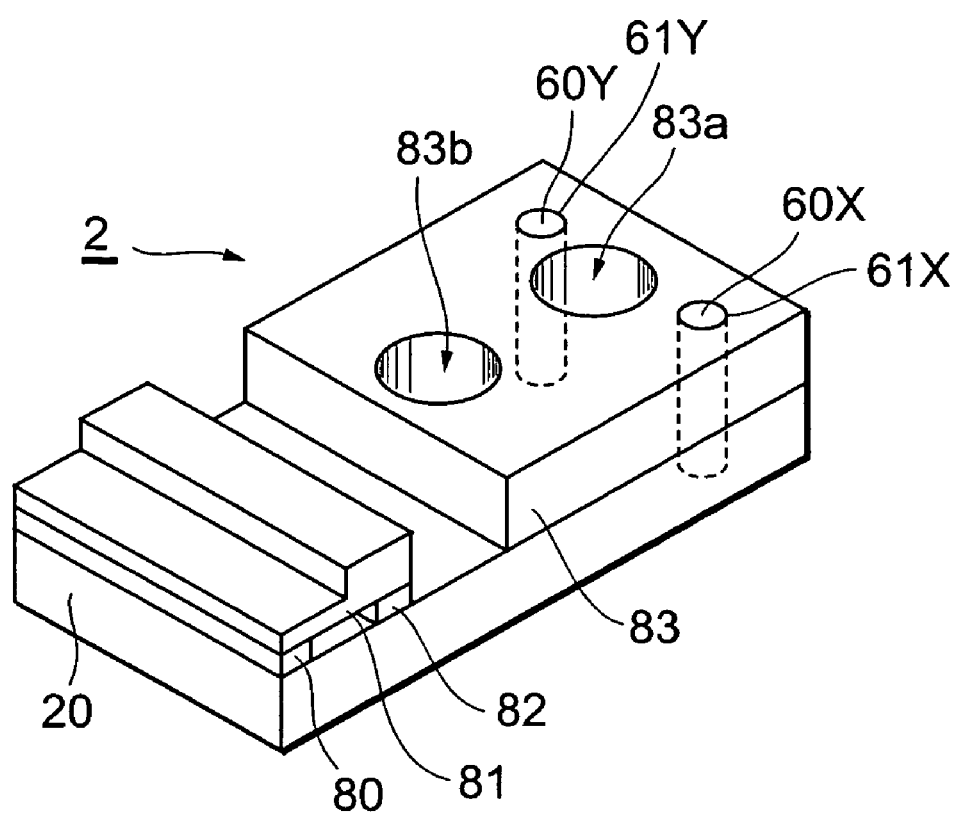
FIG. 9 is a perspective view showing a construction of a second embodiment of the semiconductor laser apparatus according to the present invention.

Next, a second embodiment of the semiconductor laser apparatus according to the present invention will be explained. FIG. 9 is a perspective view showing a construction of a semiconductor laser apparatus 2 according to the second embodiment.

The semiconductor laser apparatus 2 includes, in addition to the semiconductor laser element 80 and the metal body 21, an n-side electrode 81 on the semiconductor laser element 80, a dummy spacer 82 filled between the n-side electrode 81 and the metal body 21, and silicon rubber 83 for sealing on the metal body 21. An O-ring may be applied instead of the silicon rubber 83 for sealing.

The metal body 21 includes, as shown in FIG. 9, two columnar penetrating conductors 60X and 60Y which penetrate the metal body 21 while avoiding the fluid channel. The penetrating conductors 60X and 60Y are housed in housing holes 61X and 61Y formed in the metal body 21. The inner wall faces of the housing holes 61X and 61Y are not coated with the DLC layers. In this construction, when the metal body 21 is arranged by being sandwiched by a plurality of semiconductor laser elements 80, the metal body 21 itself serves as an electrical conduction path among the semiconductor laser elements 80.

Figure 10:
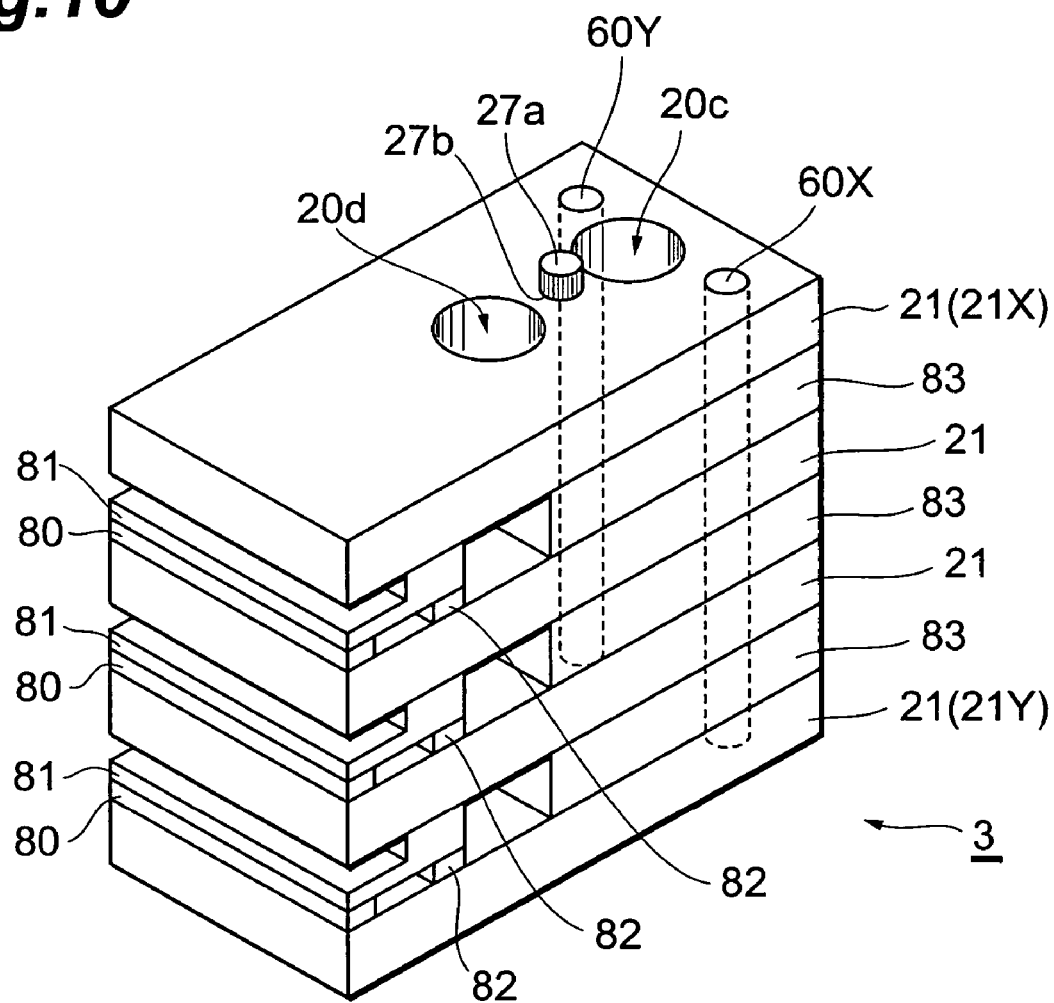
FIG. 10 is a perspective view showing a construction in which the semiconductor laser apparatus according to the second embodiment is stacked in a plurality of stages.

FIG. 10 is a perspective view showing a structure 3 in which the semiconductor laser apparatus 2 (single semiconductor laser apparatus) according to the second embodiment having the structure described above is stacked in a plurality of stages.

In the structure 3 shown in FIG. 10, it is allowed that the metal body 21X on the highest layer is connected to the negative electrode of the power source, and the metal body 21Y on the lowest layer is connected to the positive electrode of the power source. By these connections to the power source, the semiconductor laser element 80 can be made to emit a laser beam. Herein, it is preferable that the semiconductor laser apparatuss stacked in a plurality of stages are fixed by a fixing screw 27a and screw holes 27b for the screw.

Figure 11:
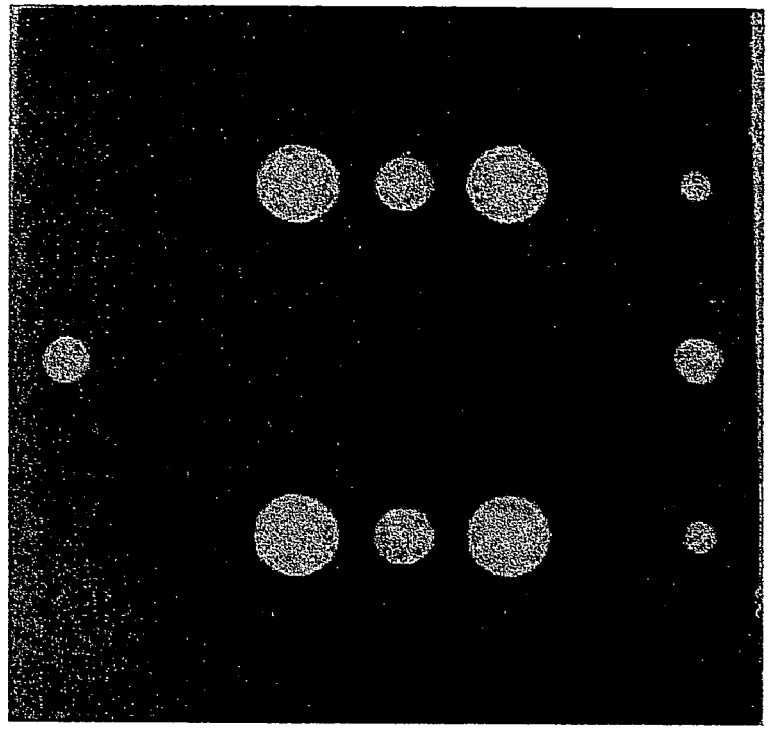
FIG. 11 shows photos of a manufacturing example for two copper-made members having through holes and housing holes.
Figure 11:
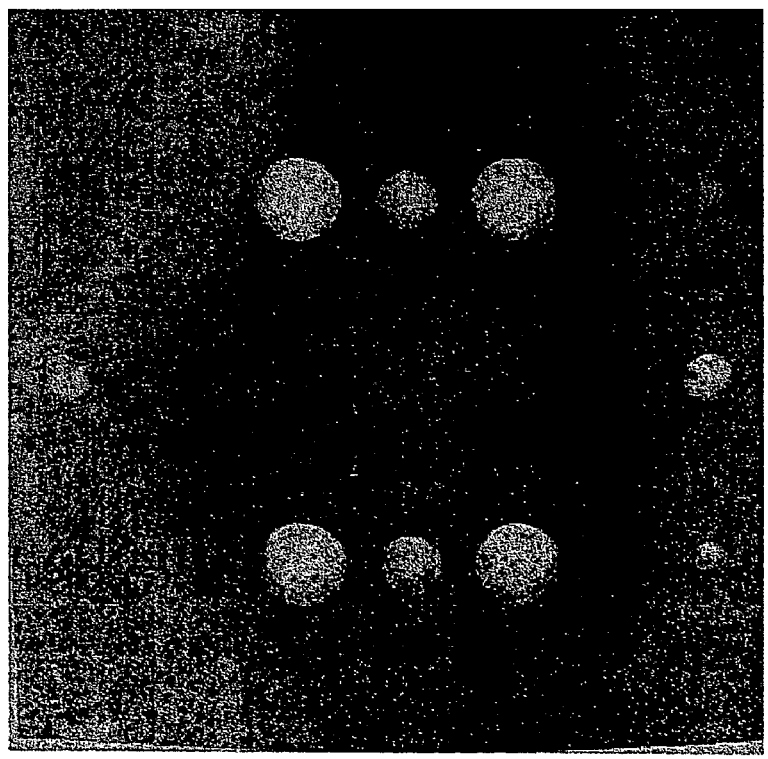
Figure 12:
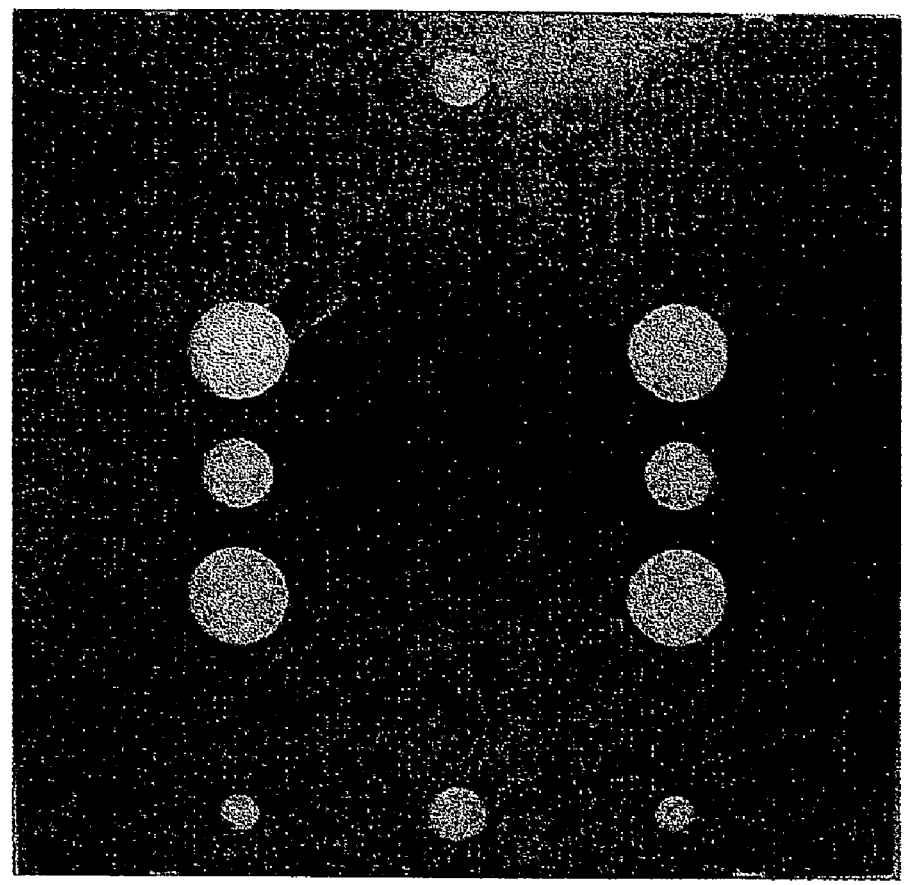
FIG. 12 shows a photo of a manufacturing example for a copper-made member having grooves, through holes, and housing holes.

Next, a manufacturing example of the copper-made member forming the metal body 21 will be shown. FIG. 11 shows photos of a manufacturing example for two copper-made members having through holes and housing holes. FIG. 12 shows a photo of a manufacturing example for a copper-made member having grooves, through holes, and housing holes.

The copper-made members shown in FIGS. 11 and 12 are continuously coated with DLC layers.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

INDUSTRIAL APPLICABILITY

A semiconductor laser apparatus according to the present invention is applicable as a high-output light source of a laser knife, a laser soldering iron, and a laser marker, etc.

The invention claimed is:

1. A semiconductor laser apparatus comprising:
a metal body which is constituted by a plurality of copper-made members and in which a flow channel is provided, said copper-made members having conductor holes at positions where said flow channel is not formed and where said conductor holes overlap each other when said copper-made members are laminated;
an adhesive interposed between said plurality of copper-made members;
diamond-like carbon layers each continuously coating the surfaces of each of said copper-made members constituting said metal body while an exposed region set on said metal body and inner walls of said conductor holes are left;
a penetrating conductor which penetrates through said conductor holes of said copper-made members while being in direct contact with each of said inner walls of said conductor holes;
a semiconductor laser element mounted on the exposed region; and
a power source, for supply a drive current to said semiconductor laser, being electrically connected to said penetrating conductor.

2. A semiconductor laser apparatus according to claim 1, wherein at least one of said plurality of copper-made members has a through hole constituting a part of said flow channel, and at least one of the remaining copper-made members has a groove that is communicated with said through hole and constitutes a part of said fluid channel.

3. A semiconductor laser apparatus according to claim 1, wherein said semiconductor laser element is arranged on the exposed region while maintaining electrical contact with said metal body.

4. A semiconductor laser array, comprising:
a plurality of semiconductor laser apparatuses, each of said semiconductor laser apparatuses having, at least, a metal body, an adhesive diamond-like carbon layer, and a semiconductor laser element mounted on an exposed region constituting the same structure as the semiconductor laser apparatus according to claim 1;
a penetrating conductor which penetrates through each of said metal bodies of said semiconductor laser apparatuses while being in electrical contact with each of said metal bodies; and
a power source, for supplying a drive current to each of said semiconductor lasers of said semiconductor laser apparatuses, being electrically connected to said penetrating conductor.

5. A semiconductor laser array according to claim 4, wherein said penetrating conductor comprises a plurality of conductor elements each being prepared for the associated one of said semiconductor laser apparatuses, each of said conductor elements being in direct contact with all copper-made members constituting said metal body of the associated one of said semiconductor laser apparatuses.

* * * * *